United States Patent [19]

Carney et al.

[11] Patent Number: 5,706,173
[45] Date of Patent: Jan. 6, 1998

[54] SUPPORT FOR LONG PCI CARD IN COMPUTER ENCLOSURE

[75] Inventors: James M. Carney, Pepperell; Dave Desilets, Hopkinton, both of Mass.; Quentin Lewis, Litchfield, N.H.

[73] Assignee: Sun Microsystems, Inc., Mountain View, Calif.

[21] Appl. No.: 673,120

[22] Filed: Jul. 1, 1996

[51] Int. Cl.⁶ .................................................. H05K 1/14
[52] U.S. Cl. ...................... 361/740; 361/741; 361/747; 361/752; 361/756; 361/759; 439/327; 312/265.6; 312/233.2
[58] Field of Search .................... 361/740, 741, 361/747, 756, 759, 752, 801, 802; 312/223.2, 223.1, 216, 293.3, 265.6; 211/26, 41; 292/102, 107; 439/61, 377, 325, 327; 206/706; 248/500, 298.1, 309.1

[56] References Cited

U.S. PATENT DOCUMENTS

| | | | |
|---|---|---|---|
| 4,478,331 | 10/1984 | Ruin | 206/707 |
| 5,383,793 | 1/1995 | Hsu et al. | 439/327 |
| 5,457,608 | 10/1995 | Scholder et al. | 361/752 |
| 5,544,006 | 8/1996 | Radloff et al. | 361/683 |

*Primary Examiner*—Leo P. Picard
*Assistant Examiner*—Phuong T. Vu
*Attorney, Agent, or Firm*—Julian Caplan; Flehr, Hohbach, Test, Albritton & Herbert

[57] ABSTRACT

An edge of a long PCI card plugs into a connector at one end of a computer enclosure. The opposite end extends into the enclosure and may be superimposed over a component such as a disk drive. The support of the present invention is rigidly mounted on the enclosure to fit under the inner end of the card. A slide on the support grips the inner end of the card. The slide is adjustably positioned on the support to accommodate cards of different lengths.

22 Claims, 4 Drawing Sheets

SUPPORT FOR LONG PCI CARD IN COMPUTER ENCLOSURE

BACKGROUND OF THE INVENTION

1. Field of the Invention

This invention relates to a new and improved support for long PCI cards used in computer enclosures. More particularly, the invention relates to a mechanical mounting for the unrestrained inner edge of a long standard PCI card.

2. Description of Related Art

Conventional computers accepting industry standard PCI cards have static "card guides" which secure and reference an edge of the card at only one position. Thus there are various means for supporting short PCI cards which snap onto an edge of the card.

Such guides do not accommodate cards of varying lengths and further the card when so supported cannot share space with other components within the enclosure such as a hard drive or a different PCI card. The present invention overcomes these deficiencies and so adds market value to the computer.

SUMMARY OF THE INVENTION

The PCI card is an industry standard I/O option card so that suppliers may create options which will work on any computer built to accommodate the card. Such cards may be approximately 4.2 inches by 7 inches in the shorter version or 4.2 inches ×13.5 inches in the long version and are approximately 0.062 thick. A connector is fixed in the computer enclosure; one edge of the card is inserted into the connector and therefor the direction of insertion is constrained, placing constraints on the mechanical design for supporting the otherwise unsupported longitudinal end of the card.

A hard drive bracket and drive bay mechanical configuration can be used either for a second hard drive or a long PCI card interchangeably according to the needs of the user. The present invention makes optimal use of the existing space in an enclosure on a desk top computer where space utilization is a primary concern. If a long card is used, then the adaptor bracket is installed into the computer by means of two captive thumb screw fasteners without the use of special tools. The adaptor consists of a base having a metal substrate and two captive fasteners plus a plastic insulation shield. A sliding card guide bracket is moveable along the base, using a metal load bar and a thumb screw tightener. Where no long PCI card is used, a hard disk drive may optionally be installed in part of the space occupied by the long PCI card.

In accordance with the invention, the long card adaptor is installed in the enclosure and then the PCI card is plugged into the connector along the rear end of the enclosure. Thereupon the sliding card guide is adjusted to the length of the particular PCI card being used and tightened with a thumb screw.

BRIEF DESCRIPTION OF THE DRAWINGS

The accompanying drawings, which are incorporated in and form a part of this specification, illustrate embodiments of the invention and, together with the description serve to explain the principles of the invention.

DETAILED DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
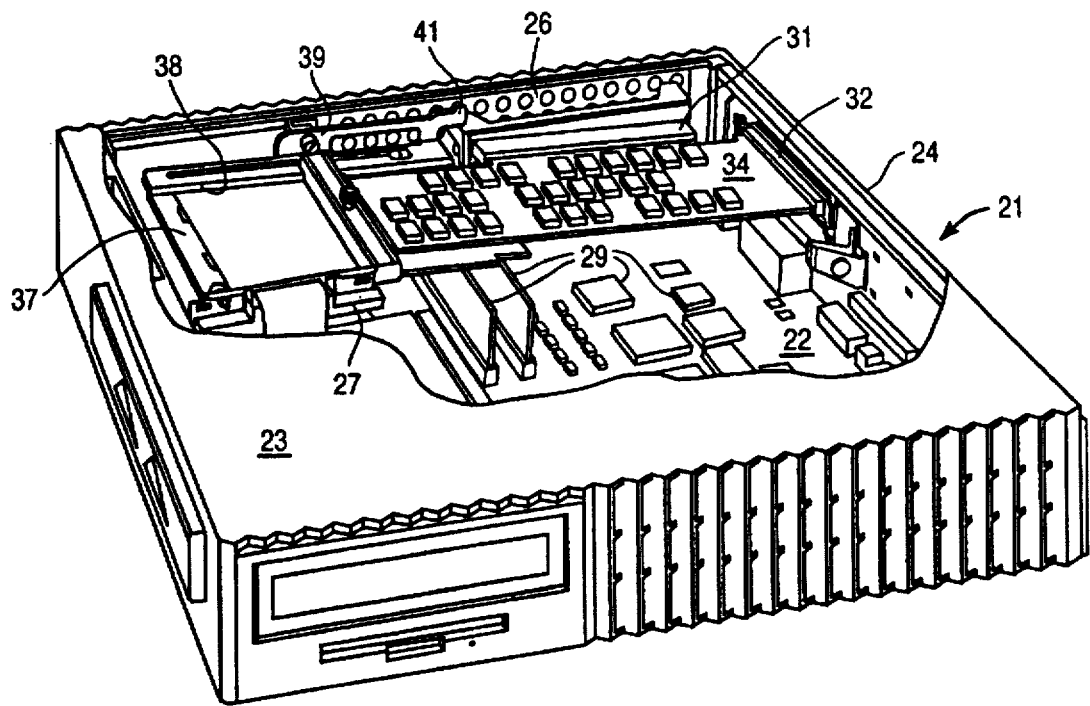
FIG. 1 is a perspective view of a computer enclosure in accordance with the present invention, the top of the enclosure being broken away to reveal internal construction.
Figure 2:
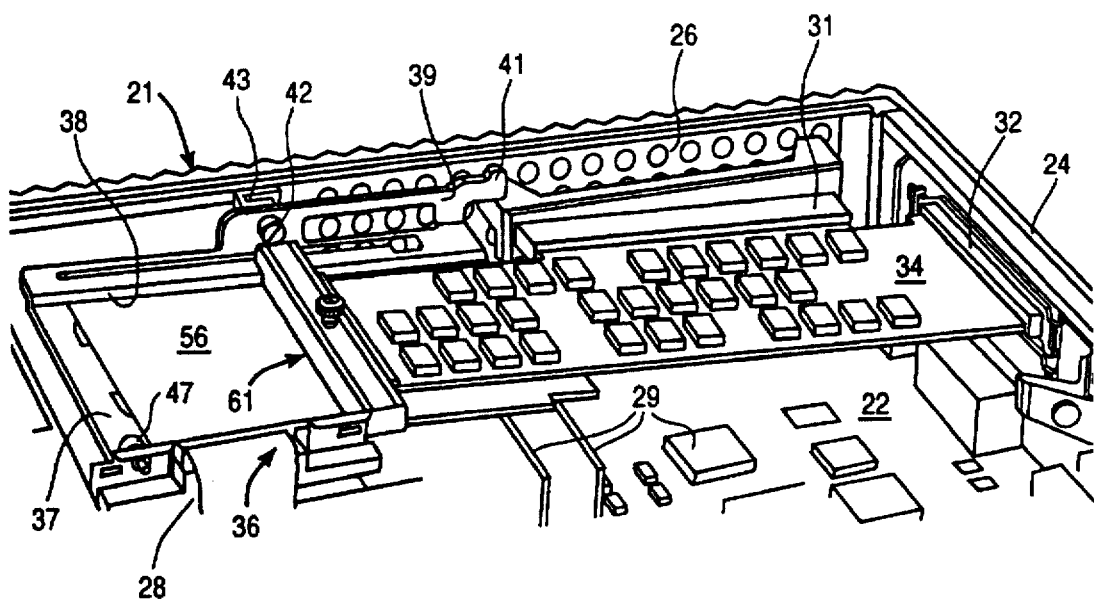
FIG. 2 is an enlarged perspective view of a portion of FIG. 1.
Figure 3:
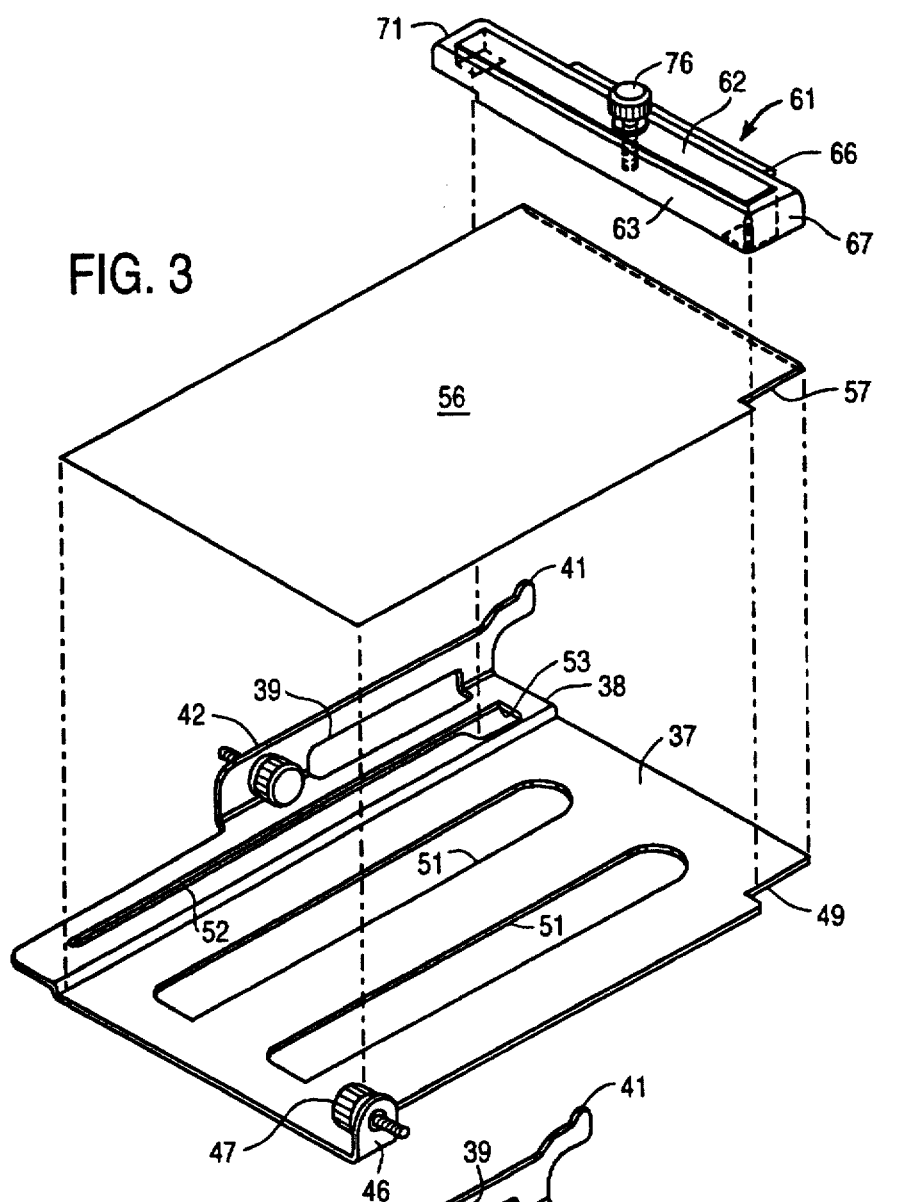
FIG. 3 is an exploded perspective view of the support for the card guide.
Figure 4:
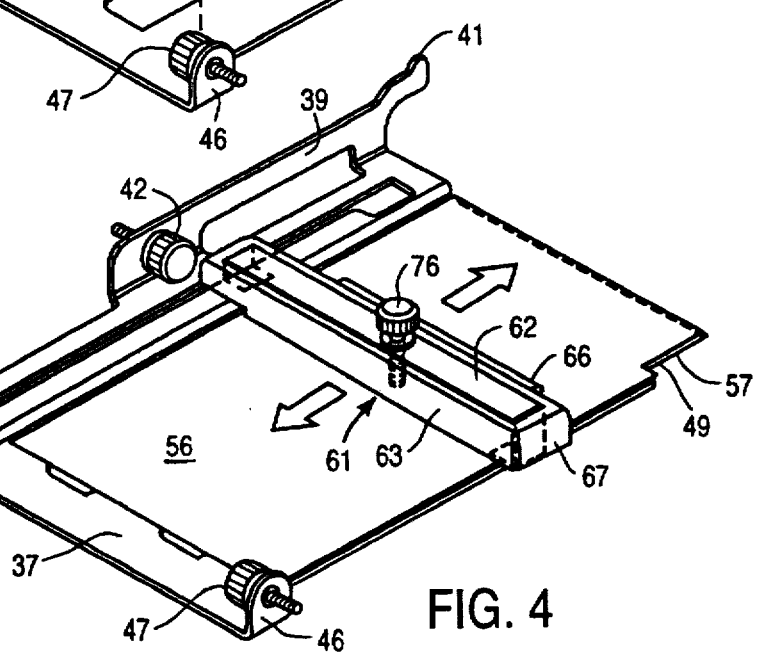
FIG. 4 is a perspective view showing the components of FIG. 3 assembled.
Figure 6:
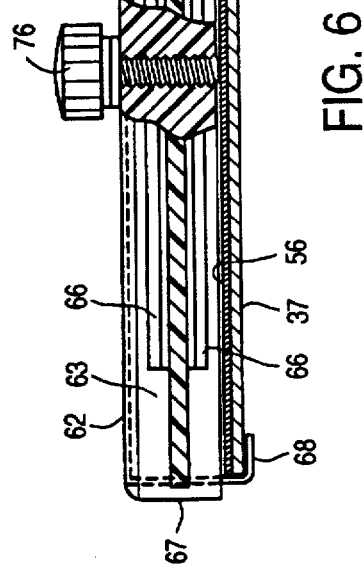
FIG. 6 is a sectional view substantially along the line 5—5 of FIG. 6.
Figure 5:
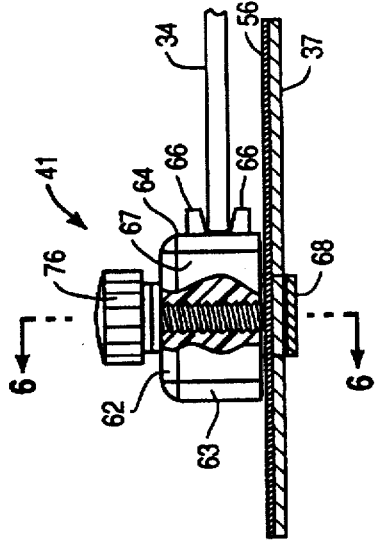
FIG. 5 is a fragmentary end elevational view of the slide of the present invention broken away to reveal internal construction.
Figure 7:
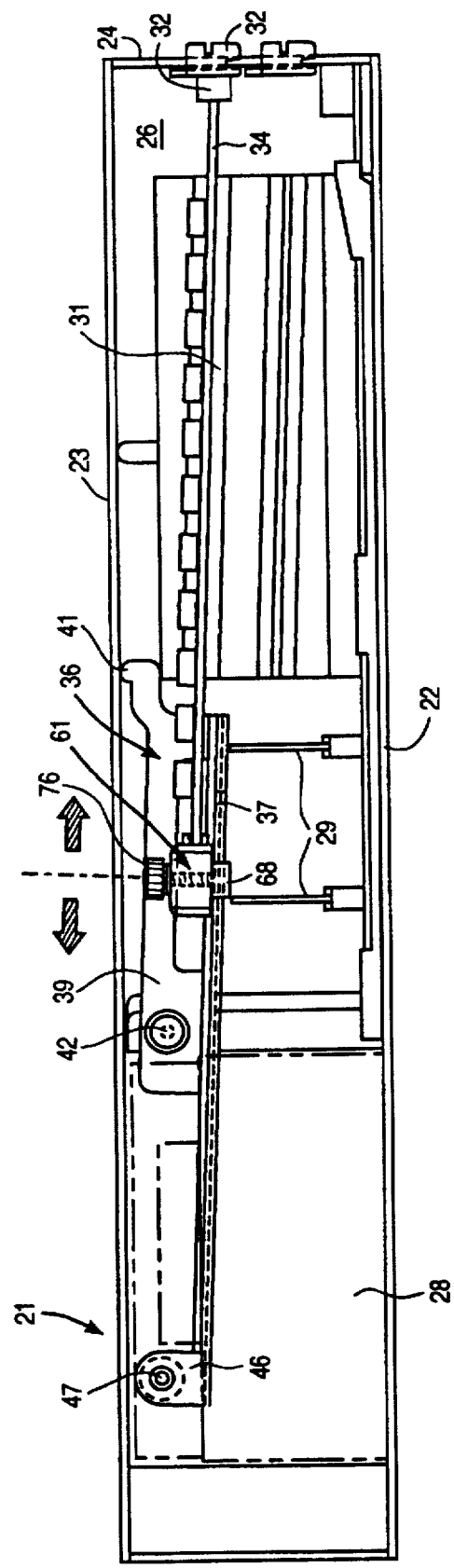
FIG. 7 is a side elevational view of a portion of the structure of FIG. 2.
Figure 8:
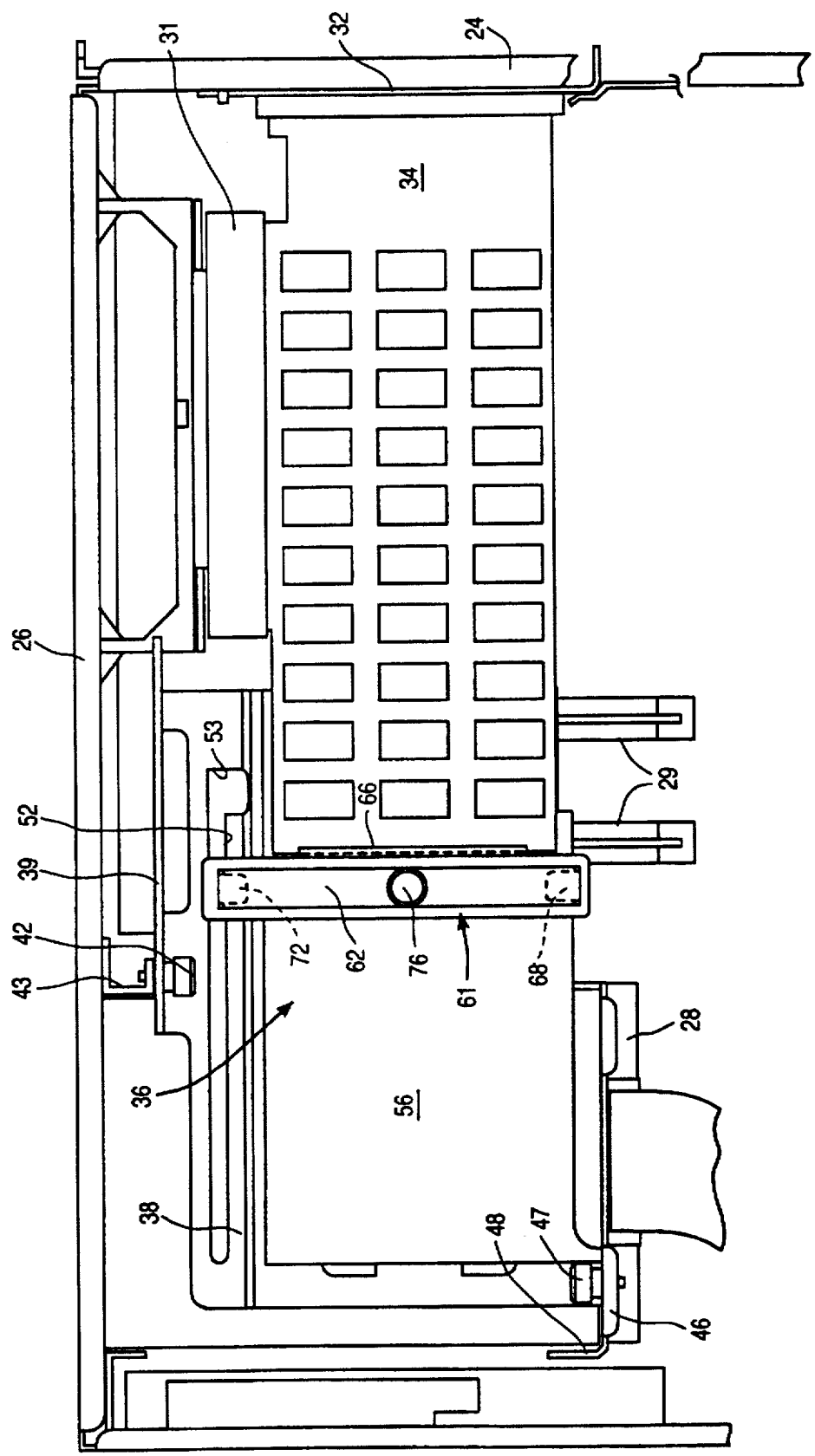
FIG. 8 is an enlarged top plan view of the structure of FIG. 7.

FIG. 1 illustrates a typical container enclosure 21, the top of the enclosure being broken away to reveal internal construction. Enclosure 21 has a bottom 22, top 23, rear end 24, and side 26. Within the enclosure may be mounted a disk drive 28, and other electronic components 29, for example. If no long PCI card is installed, a second disk drive (not shown) may be installed above drive 28. On one side 26 adjacent rear wall 24 is a plug-in connector 31 of conventional structure attached to side 26.

The present invention employs an industry standard long PCI card 34, one short end of which is attached to a cover 32 which closes off an I/O opening in rear wall 24 and is secured to the rear wall 24 by means not shown but well understood in the art. The other short end of card 34 extends inwardly of the enclosure 21, and in the case of the present invention may be slanted upwardly inwardly so that it may be superimposed over disk drive 28 and various electronic components 29. It will be understood that leaving the end of card 34 unsupported may cause electrical and mechanical difficulties, including safety problems. A portion of one longitudinal edge of card 34 may be plugged into pin connector 31 attached to side wall 26 adjacent rear wall 24.

In accordance with the present invention, support 36 is provided. Such support consists of a metallic plate 37 having one narrow raised side 38 and an upwardly bent edge 39 outwardly of side: 38. The distance between raised side 38 and the opposite edge of plate 37 is approximately equal to the width of card 34. The contour of edge 39 is irregular, and it will be seen that there is a top contactor 41 which engages top 23 to rigidify the support 36 within the enclosure. Screw 42 mounted in edge 39 screws into a bracket 43 fixed to side 26 or other suitable mount within the enclosure 21. The opposite edge of plate 37 has an upwardly bent tab 46 which supports a similar screw 47 which screws into another bracket 48 suitably mounted in the enclosure 21. Preferably screws 42 and 47 are "captive" in that they are permanently retained in edge 39 and tab 46, respectively. The inner forward edge of plate 37 is formed with a notch 49. Openings 51 are formed in plate 37 and along the raised side 38 is an elongated slot 52, the forward edge of which is formed with an inwardly extending enlargement 53.

Protector plate 56 formed of a non-conductive plastic such as MYLAR is formed with a notch 57 corresponding to the notch 49. Protector plate 56 is preferably adhered to plate 37 to insulate the card 34 from plate 37. Openings 51 may be formed in plate 37. Moveable longitudinally of plate 37 is a slide 61 consisting of a top 62, back 63, front 64, and a first side 67 formed with an inwardly extending foot 68 and a second side 71 also formed with an inwardly extending foot 68. Front 64 supports two horizontal card edge guides 66 which support the inner edge of card edge 34.

In order to install the slide 61, foot 68 is inserted in enlargement 53 and foot 72 clears notches 49 and 57. The slide 61 is then moved laterally outwardly and then forwardly, the feet 68 and 72 fitting under the edges of raised portion 38 and plate 67 respectively. Knob 76, which is fixed to top 62, engages protector plate 56 and forces it against plate 37 and at the same time raises feet 68 and 72 to guides the plate 37 and hold the slide in a position of adjustment such that the guides 66 hold the inner edge of card 34 and the portion of plate 37 beyond slide 61 supports the adjacent edge of card 34.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A computer enclosure having a support for the inner end of a long PCI card comprising a panel, first means on said panel to support an outer end of the long PCI card, a plate, second means for mounting said plate in said enclosure remote from said panel positioned to fit under the inner end of the long PCI card, a slide movable relative to said plate, and guides on said slide to engage the inner end of the long PCI card, and adjustment means to hold said slide in position on said plate, said plate and said first means being spaced apart.

2. A support according to claim 1 in which said plate is cut away in a limited area to accept said slide, said slide being movable away from said limited area, whereby said slide may be installed on and removed from said plate, said slide being non-removable from said plate when said slide is moved from said limited area.

3. A support according to claim 2 in which said plate is formed adjacent a first edge with a longitudinal slot and an inward enlargement at said limited area and said plate is formed with a notch at a second edge opposite said inward enlargement.

4. A support according to claim 1 which further comprises an insulation plate on said first-mentioned plate.

5. A support according to claim 4 in which said slide further comprises adjustment means to hold said slide in position relative to said first-mentioned plate.

6. A support according to claim 1 in which said means for mounting said plate comprises at least two upstanding tabs on said plate and screws extending through said tabs to engage brackets on a computer enclosure in which said support is mounted.

7. A support for the inner end of a long PCI card comprising a plate, means for mounting said plate in a computer enclosure positioned to fit under the inner end of the long PCI card, a slide movable relative to said plate, and guides on said slide to engage the inner end of the long PCI card, and adjustment means to hold said slide in position on said plate, said mount comprising at least two upstanding tabs on said plate and screws extending through said tabs to engage brackets on a computer enclosure in which said support is mounted, in which at least one said tab having an upward extending contactor to engage a top for the enclosure to rigidify said plate relative to the enclosure.

8. In combination, a computer enclosure having an end panel, a connector in said enclosure on said end panel, a long PCI card in said enclosure having an edge detachably connected to said connector adjacent a first end and a second end extending into said enclosure, a support for said second end, said support comprising a plate, means for mounting said plate in said computer enclosure positioned to fit under said second end of said card, a slide movable relative to said plate, and guides on said slide to engage said second end of said card, and adjustment means to hold said slide in position on said plate, said plate and said connector being spaced apart.

9. The combination of claim 8 in which said slide may be installed on and removed from said plate, said plate being cut away in a limited area to accept said slide, said slide being movable away from said limited area, said slide being non-removable from said plate when said slide is moved from said limited area.

10. The combination of claim 9 in which said plate is formed adjacent a first plate edge with a longitudinal slot and an inward enlargement at said limited area and said plate is formed with a notch at a second plate edge opposite said inward enlargement.

11. The combination of claim 8 which further comprises an insulation plate on said first mentioned plate, said insulation plate extending under said second end of said card.

12. The combination of claim 11 in which said slide further comprises adjustment means to hold said slide in position relative to said first-mentioned plate.

13. The combination of claim 8 in which said means for mounting said plate comprises at least two upstanding tabs on said plate, screws extending through said tabs and brackets on said enclosure to receive said screws.

14. In combination, a computer enclosure having an end, a connector in said enclosure, a long PCI card in said enclosure having an edge detachably connected to said connector adjacent a first end and a second end extending into said enclosure, a support for said second end, said support comprising a plate, means for mounting said plate in said computer enclosure positioned to fit under said second end of said card, a slide movable relative to said plate, and guides on said slide to engage said second end of said card, and adjustment means to hold said slide in position on said plate, said means for mounting said plate comprising at least two upstanding tabs on said plate, screws extending though said tabs and brackets on said enclosure to receive said screws, said enclosure having a top and in which at least one said tab has an upward extending contactor engaging said top to rigidify said plate relative to said enclosure.

15. In combination, a computer enclosure having an end, a connector in said enclosure, a long PCI card in said enclosure having an edge detachably connected to said connector adjacent a first end and a second end extending into said enclosure, a support for said second end, said support comprising a plate, means for mounting said plate in said computer enclosure positioned to fit under said second end of said card, a slide movable relative to said plate, and guides on said slide to engage said second end of said card, and adjustment means to hold said slide in position on said plate, said enclosure having a bottom and a plurality of electronic components on said bottom, said card extending over said electronic components said plate and said connector being spaced apart.

16. The combination of claim 15 in which said components comprises a disk drive.

17. The combination of claim 16 which further comprises means for mounting a second disk drive above said first-mentioned disk drive, said means for mounting said second disk drive being obstructed by said plate when said plate is mounted in said enclosure, said means for mounting said second disk drive being accessible for installation of said second disk drive when said plate is removed.

18. A computer enclosure for supporting the inner end of a long PCI card comprising a panel, a support on said panel for an outer end of the long PCI card, a plate, a mount for said plate in said enclosure remote from said panel positioned to fit under the inner end of the long PCI card, a slide movable relative to said plate, and guides on said slide to engage the inner end of the long PCI card, and an adjustment to hold said slide in position on said plate, said plate and said support being spaced apart.

19. A support in a computer enclosure for the inner end of a long PCI card comprising a plate, a mount for said plate positioned to fit under the inner end of the long PCI card, a slide movable relative to said plate, and guides on said slide to engage the inner end of the long PCI card, and an adjustment to hold said slide in position on said plate, said mount comprising at least two upstanding tabs on said plate and screws extending through said tabs to engage brackets on a computer enclosure in which said support is mounted, in which at least one said tab having an upward extending contractor to engage a top for the enclosure to rigidify said plate relative to the enclosure.

20. In combination, a computer enclosure having an end panel, a connector in said enclosure on said end panel, a long PCI card in said enclosure having an edge detachably connected to said connector adjacent a first end and a second end extending into said enclosure, a support for said second end, said support comprising a plate, a mount for said plate in said computer enclosure positioned to fit under said second end of said card, a slide movable relative to said plate, and guides on said slide to engage said second end of said card, and an adjustment to hold said slide in position on said plate, said plate and said connector being spaced apart.

21. In combination, a computer enclosure having an end, a connector in said enclosure, a long PCI card in said enclosure having an edge detachably connected to said connector adjacent a first end and a second end extending into said enclosure, a support for said second end, said support comprising a plate, a mount for said plate in said computer enclosure positioned to fit under said second end of said card, a slide movable relative to said plate, and guides on said slide to engage said second end of said card, and an adjustment to hold said slide in position on said plate, said mount comprising at least two upstanding tabs on said plate, screws extending though said tabs and brackets on said enclosure to receive said screws, said enclosure having a top and in which at least one said tab has an upward extending contactor engaging said top to rigidify said plate relative to said enclosure.

22. In combination, a computer enclosure having an end, a connector in said enclosure, a long PCI card in said enclosure having an edge detachably connected to said connector adjacent a first end and a second end extending into said enclosure, a support for said second end, said support comprising a plate, a mount for said plate in said computer enclosure positioned to fit under said second end of said card, a slide movable relative to said plate, and guides on said slide to engage said second end of said card, and an adjustment to hold said slide in position on said plate, said enclosure having a bottom and a plurality of electronic components on said bottom, said card extending over said electronic components, said plate and said connector being spaced apart.

* * * * *